United States Patent
Delaney et al.

(10) Patent No.: US 6,265,945 B1
(45) Date of Patent: Jul. 24, 2001

(54) ATOMIC FREQUENCY STANDARD BASED UPON COHERENT POPULATION TRAPPING

(75) Inventors: Michael J. Delaney, Amesbury; Kristin N. Bonnette, Wenham; Daniel E. Janssen, Hamilton, all of MA (US)

(73) Assignee: Kernco, Inc., Danvers, MA (US)

(*) Notice: Subject to any disclaimer, the term of this patent is extended or adjusted under 35 U.S.C. 154(b) by 0 days.

(21) Appl. No.: 09/427,397

(22) Filed: Oct. 25, 1999

(51) Int. Cl.[7] ............................. H03L 7/26; H01S 1/06
(52) U.S. Cl. ........................................ 331/3; 331/94.1
(58) Field of Search ................................. 331/3, 94.1

(56) References Cited

U.S. PATENT DOCUMENTS 5,161,053 * 11/1992 Dabbs ........................... 359/384
5,327,105 * 7/1994 Liberman et al. ................ 331/94.1
5,657,340 * 8/1997 Camparo et al. ..................... 372/69

FOREIGN PATENT DOCUMENTS 9-83076 * 3/1997 (JP).

\* cited by examiner

Primary Examiner—David Mis
(74) Attorney, Agent, or Firm—Barry R. Blaker

(57) ABSTRACT

An atomic frequency standard is disclosed where optical pumping of the resonance cell is achieved by coherent light and the pumping results in Coherent Population Trapping of the resonant alkali metal atoms. The fabrication of frequency standards of substantially reduced size and weight is permitted by use of solid state laser sources having certain integrated optical modifier elements and a resonance cell of metallic construction.

17 Claims, 5 Drawing Sheets

ATOMIC FREQUENCY STANDARD BASED UPON COHERENT POPULATION TRAPPING

BACKGROUND OF THE INVENTION

The present invention relates generally to the field of atomic frequency standards and is more particularly directed to atomic frequency standards in which the energy state of an atomic ensemble is prepared by optical pumping using the coherence property of a laser light source.

In some prior art atomic frequency standards using alkali metal atoms, such as cesium 133 or rubidium 85 or 87 as the resonance source atoms, the energy states of the source atoms are prepared by optical pumping of a cell containing an admixture of alkali metal atoms and one or more buffer gases and using the intensity of a light source, particularly a laser light source, to achieve the optical pumping. More recently, atomic frequency standards have been developed in which the coherence property of a laser light source, rather than its intensity, is utilized to prepare the energy states of the source atoms and in which the quantum physics phenomenon of Coherent Population Trapping (hereinafter CPT) takes place wherein the ground state energy populations of the atomic ensemble remain unaltered. FIG. 1 hereof depicts a generalized scheme in which the CPT frequency standard is achieved. Referring to FIG. 1, there is provided a sealed, optically transparent resonance cell containing the alkali metal source atoms and buffer gases. The beam of a laser light source of appropriate wavelength for the particular alkali metal utilized as the source material is directed, seriatim, through a linear polarizer and a circular polarizer (λ/4 plate) and thence into said cell. Where a single laser light source is employed it is modulated over a frequency range, including a subharmonic of the hyperfine ground state 0-0 transition frequency of the alkali metal atoms contained in the resonance cell, thereby causing the laser to emit as sidebands two radiation fields whose frequency difference is equal to the hyperfine frequency of the alkali metal atoms contained in the resonance cell. Where two laser sources are employed, said lasers are phase-locked to one another with a frequency separation equal to the hyperfine frequency of the alkali metal atoms, thereby to also establish. two radiation fields of the type described above in respect of a single laser operated with two sidebands. The alkali metal atoms within the resonance cell are thus submitted to these radiation fields and resonance of said atoms takes place wherein a strong coherence of the ground state occurs at the hyperfine frequency and wherein transitions to the excited P state are inhibited. Thus, at resonance, all alkali metal atoms within the resonance cell are trapped in the ground state, no transitions take place from the ground state to the excited P state and no energy is absorbed from the laser radiation due to such transitions. The resonance phenomenon is signalled by: (a) a sharp increase in the intensity of the laser radiation transmitted through the cell along the laser beam axis and/or (b) by a sharp decrease in the intensity of fluorescence transmitted from the cell normal to the laser beam axis. Thus, either or both of these CPT resonance cell phenomena are detectable by stationing photodetector means: (i) to receive and detect the intensity of the laser light source beam transmitted through. the resonance cell along the beam axis and/or (ii) to receive and detect the fluorescent light generated within the resonance cell normal to the beam axis.

Frequency standards based upon the general CPT technology outlined above hold much promise in permitting substantial reduction in the size of atomic frequency standards from those of the prior art, due in large measure, to the absence, in CPT based standards, of the need for a relatively bulky and often operationally troublesome microwave cavity to surround the resonance cell. Both CPT based and other atomic frequency standards of current production have sizes averaging in the vicinity of 3×3×6 inches. However, it is obvious from even peripheral knowledge of, for instance, the fields of telecommunications, satellite navigation transmitters and receivers and the like, that further substantial diminution in size, and weight, of atomic frequency standards, already utilized extensively in these fields for extremely accurate and necessary timing functions, represents an important desideratum. In accordance with the present invention, such further diminution in size and/or weight from prior art atomic frequency standards is now permitted.

It is a principal object of the invention to provide a novel atomic frequency standard based upon the quantum atomic physics phenomenon of Coherent Population Trapping.

It is another object of the invention to provide an atomic frequency standard of the aforesaid type and of substantially diminished physical size occupying, say, a total volume of no greater than about 200 cubic centimeters.

It is another object of the invention to provide an atomic frequency standard of the aforesaid type which can be assembled with relative facility and rapidity.

It is still another object of the invention to provide an atomic frequency standard in which the elements of the optical physics package forming part thereof can be assembled relatively rapidly and in optically correct relationship.

Other objects and advantages of the present invention will, in part, be obvious and will, in part, appear hereinafter.

SUMMARY OF THE INVENTION

The CPT based atomic frequency standard of the invention broadly comprises a frame element receiving thereon an optical physics package and an electronic control and detection package. The optical physics package includes: (i) at least one solid state laser source element for providing coherent light radiation and, integral therewith, (ii) optical modifier elements comprising a linear polarizer and a circular polarizer; (iii) a sealed metallic resonance cell containing an atomic ensemble of alkali metal resonance material and buffer gas atoms, said cell comprising optically transparent windows to receive the coherent circularly polarized light radiation therein and to transmit therefrom at least one of light transmitted therethrough and fluorescent light generated therein; and (iv) photodetector means to receive and detect at least one of transmitted and fluorescent light from said resonance cell. The electronic control and detection package is cooperative with the physics package to control and modulate said laser source in frequency and to bring about resonance and the phenomenon of Coherent Population Trapping of the alkali metal atoms within said cell, to control the physical environment of said laser source and said resonance cell and to detect resonance of said alkali metal atoms within said cell. In one preferred embodiment of the invention said frame element comprises cooperative means, such as keyways of appropriate geometry, to receive, urge and maintain the discrete separate elements of the optical physics package correct optical interrelationship with one another.

DETAILED DESCRIPTION OF THE INVENTION

Figure 2:
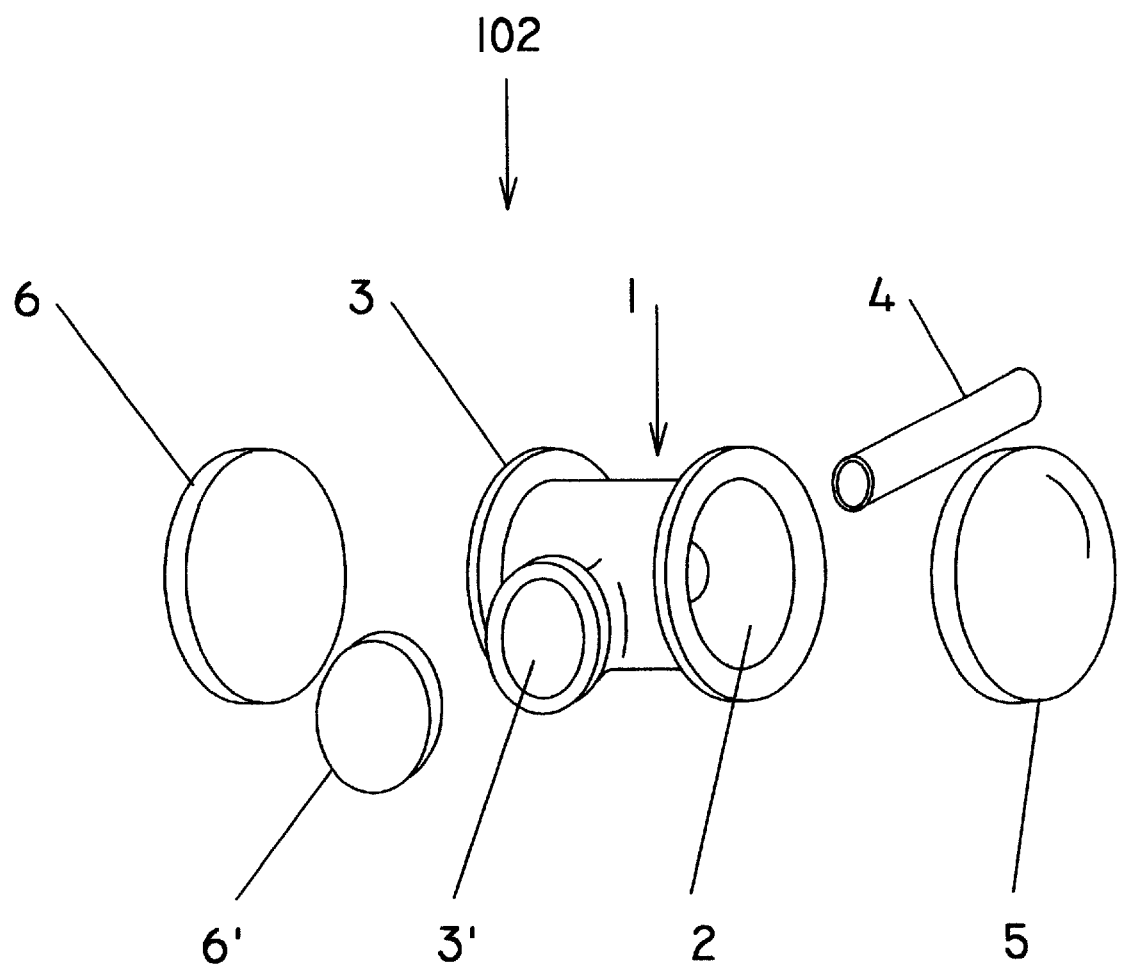
FIG. 2 is an exploded view of a resonance cell particularly suitable for use in the present invention.

Referring now to FIG. 2, there is depicted a resonance cell 102 construction particularly suitable for use in the present invention. Said resonance cell 102 comprises a stiff, nonmagnetic metallic chamber body 1 having at least one inlet window aperture 2, at least one outlet window aperture 3, 3' and integrally attached thereto, a cold weldable metallic pinch-off tubulation 4 through which the atomic resonance source material components are charged into said chamber body. The cold weldable metallic pinch-off tubulation 4 can be formed, for example, of copper or nickel. Sealed to the inlet window aperture 2 is an optically transparent inlet window element 5 which may be composed of glass, fused silica, quartz or sapphire. Sealed to each of the outlet window apertures 3, 3' is an optically transparent outlet window element 6, 6'. Such sealing of the window elements to the metallic chamber apertures can be achieved by any conventional glass-to-metal sealing technique, such as by suitably metallizing said window elements and brazing the metallized elements to the metallic chamber apertures. Upon sealing of the window elements to the metallic chamber body 1, and after cleaning and firing of the assembly, a precise charge of the atomic resonance source material which, as mentioned, is an alkali metal in admixture with one or more buffer gas(es), is charged into the chamber body 1 through tubulation 4 and the tubulation pinched off by conventional cold welding thereof. Thus, the sealing of the metallic chamber body 1 in the preferred cell construction of the invention is achieved substantially more simply and easily than by the high temperature fusion tip-offs conventionally employed to seal glass bodied resonance cells and without the thermal perturbations of the resonance source material composition charge and the possibility of chemical adulteration thereof which accompanies a conventional glass fusion tip-off. Suitable metals from which the chamber body 1 is constructed can be, for example, AISI designation 404 Monel metal, titanium, tantalum, beryllium, tungsten, stainless steel, copper and molybdenum.

The use in the present invention of a resonance cell of metallic construction of the type described hereinabove is also advantageous over glass bodied cells in the substantially greater resistance of such metallic bodied cells to helium diffusion therethrough as compared to glass cells. Thus, adulteration over time of the resonance source material composition charge contained within the cell 102 by helium diffusion thereinto through the chamber body 1 is prevented or at least vastly slowed relatively to glass bodied cells. Of even greater significance in respect of the present invention, wherein an object is to permit construction of an atomic frequency standard of vastly reduced size over presently available standards, it will be recognized that, in general, the smaller the resonance cell 102 size and mass, the greater will be the overall effect of environmental temperature on the internal temperature of the cell. In atomic frequency standards it is known that precise temperature control of the interior of the cell is necessary in order to achieve acceptable results. Thus, in optically pumped atomic frequency standards of the prior art it is conventional to provide the cell with. various thermal insulation blankets and temperature control heaters in order to maintain constancy of internal cell temperature. In the present invention, a glass cell, due to the relatively low thermal conductivity of glass materials, in general, would be excessively slow to either exhibit a temperature change within the cell or to conduct externally applied heat therethrough at a sufficient rate as to allow quick adjustment and attainment of constancy of its internal temperature. The use of a metallic cell 102 in the present invention solves this problem and allows for both rapid detection of internal cell temperature change and for rapid adjustment and control of the cell temperature through the application of external heat thereto.

Figure 3:
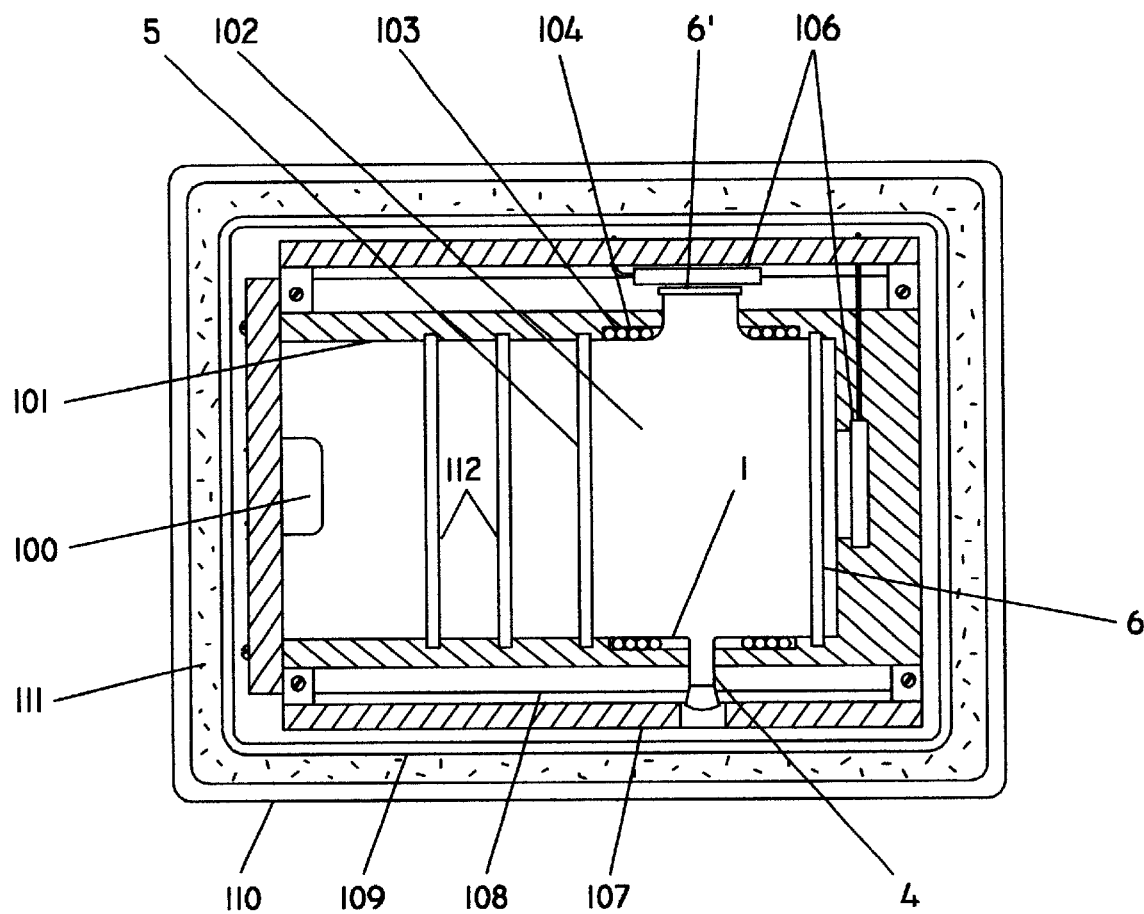
FIG. 3 is a partially sectional plan view of one embodiment of an atomic frequency standard in accordance with the present invention.
Figure 4:
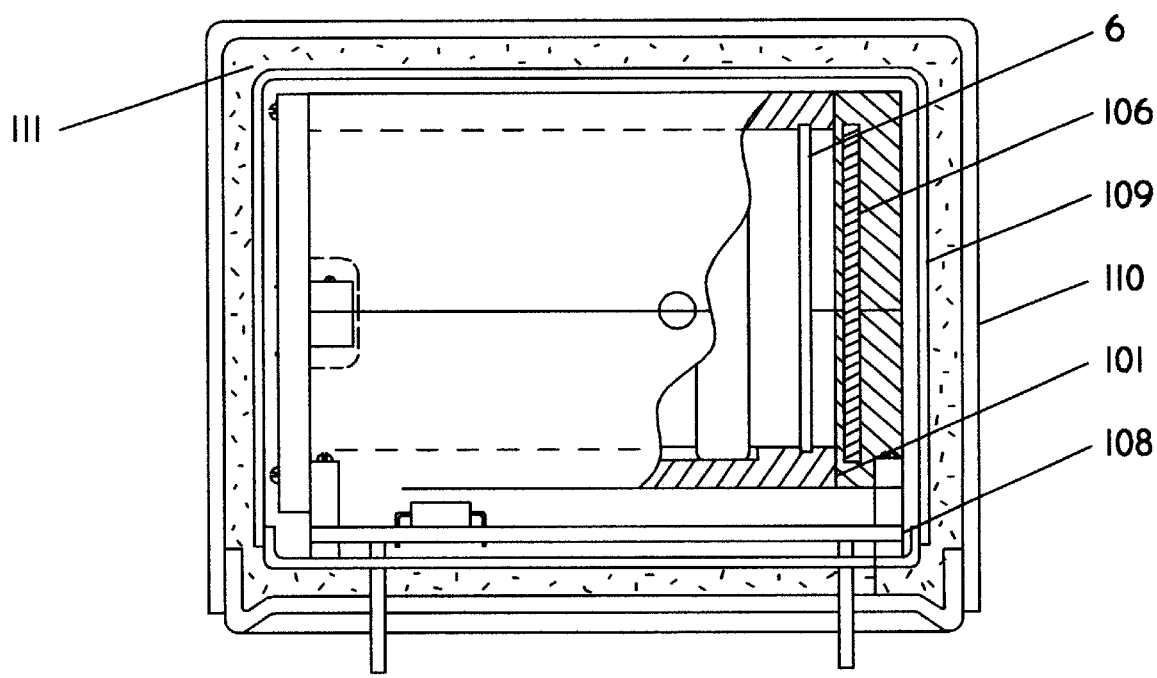
FIG. 4 is a partially sectional side view of the atomic frequency standard of FIG. 3.

Referring now to FIGS. 3 and 4 hereof, wherein like reference numerals refer to like structures, the atomic frequency standard of the invention comprises a frame element 101 to which an optical physics package and an electronic control and detection package are secured. The frame element 101 is constructed of thermally stable material suitable for housing the elements of the optical physics package without damage or distortion of their optical properties. Preferably, the frame element 101 is provided with means to receive, urge and maintain the elements of the optical physics package in proper optical alignment with respect to one another. In the particular embodiment shown said means comprises keyways formed in the frame element 101 and of appropriate dimensions and geometries so as to achieve this beneficial result.

Figure 1:
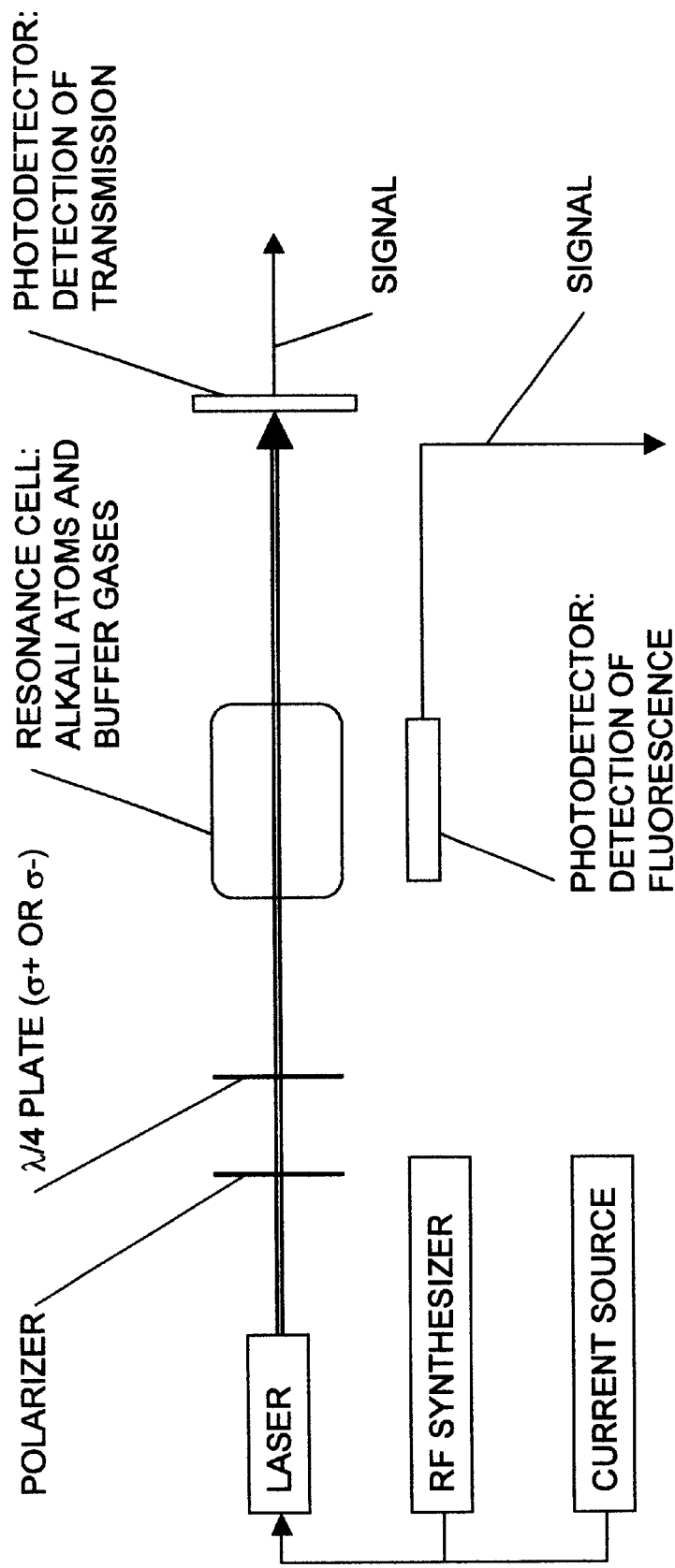
FIG. 1 is a generalized block diagram showing an atomic frequency standard system based upon the Coherent Population Trapping phenomenon.

The optical physics package of the atomic frequency standard of the invention broadly comprises a laser assembly 100, a sealed metallic resonance cell 102 containing the alkali metal buffer gas mixture therein and photodetector means 106 to receive and detect at least one, and preferably both, of transmitted and fluorescent light from said resonance cell 102. An advantage in detecting the reduction in fluorescent light intensity over detecting the increase in transmitted light intensity resides in the fact that the detection of fluorescence normally encounters lesser transmission radiation background noise than does the detection of transmitted light. The laser assembly 100 comprises one or more solid state laser sources and has integral therewith certain critical optical modifier elements to modify or alter the physical characteristics of the radiation emanating from said laser source(s). Preferably, the laser source comprises an array of Vertical Cavity Surface Emitting Lasers (VCSEL) and, also of preference, said lasers are arranged such that only one of said VCSELs is operative at any point in time. The total number of laser sources provided in the array is subject to considerable variation. However, in particular light of consideration of spatial requirements, it is contemplated that no more than about 10 such sources will be employed per array. The use of plural laser sources in an array provides substantial redundancy in the system and assures that failure of any or several of the total number of laser sources of the array does not render the frequency standard inoperative. The essential integrated modifier elements of the laser assembly 100 are a linear polarizer and a circular polarizer. It will be recognized that solid state lasers inherently provide light radiation which is linearly polarized. However, the plane of said linear polarization in solid state lasers of commerce normally varies from one laser to another of the same make, model and production run. Thus, by the term "linear polarizer" as utilized herein, it is meant an optical modifier element which either converts the inherent linear polarization of solid state laser radiation to a fixed common plane or which, alternatively, itself affirmatively linearly polarizes said laser radiation to a fixed common plane. The second essential integral optical modifier element of the laser assembly 100 is a circular polarizer, such as the quarter wavelength plate shown in FIG. 1. Such circular polarization of the laser radiation is necessary in the frequency standards of the present invention because certain transitions within the resonance source alkali atoms contained in the resonance chamber 102 are forbidden when only linearly polarized radiation is utilized to optically pump the resonance cell 102. Techniques by which linear and circular polarizing elements can be formed integrally with solid state laser sources are within the purview of the solid state laser fabrication art and require no further elaboration herein. It should be recognized, as well, that optical modifier elements other than linear and circular polarizers, such as beam expanders, collimators, attenuators, focusing lens and the like, can also be included in the atomic frequency standards of the invention and can be integral with or separate from the laser assembly 100. Where such additional optical modifier elements are to be employed separate and apart from the laser assemble 100, they, too, can be keyed to the frame element 101, such as by means of keyways 112.

Surrounding the resonance cell 102 is a cell heater 103 comprising a bifilar winding which is tightly wound about the metallic chamber body 1 and which produces, at a maximum, negligent magnetic fields when DC power is applied thereto. It is, of course, the role of said cell heater 103 to maintain the internal temperature of the resonance cell 102 at an optimal set-point, thereby fostering maximum resonance cell and, ultimately, frequency standard performance.

Also surrounding the resonance cell 102 is a solenoid 104, comprising a cylindrical winding lying in proximity to the bifilar winding of cell heater 103. Said solenoid winding is employed to produce a homogeneous magnetic field whereby there is provided an axis of quantization to the atomic resonance source admixture within the cell 102.

As is generally known in the art, the atomic frequency standard of the present invention also includes a magnetic shield 109 surrounding the entire frame element 101 and both the optical physics and electronic control and detection packages secured thereto, thereby to reduce the ambient magnetic field within the device to a negligible level so as to avoid affecting the hyperfine frequency of the alkali metal resonance source atoms residing within the resonance cell 102. Furthermore, said shield 109 also provides a generally isothermic enclosure to reduce environmental thermal effects and may be coated internally, as well as externally, to manipulate the surface emmisivity, thereby enhancing thermal properties. A housing 110, composed of a rigid material, is disposed over the frequency standard and is spaced from said magnetic shield 109. Said housing 110 provides physical protection to the components and elements residing therein. Said housing 110 may be composed of a material which also provides electromagnetic and/or electrostatic shielding of the device contained therewithin. Finally, the space 111 between the magnetic shield 109 and the housing 110 serves as a thermal insulator and can contain thermal insulator material therein, such as a rigid closed cell foam, flexible foam rubber or even a vacuum.

The electronic control and detection package of the atomic frequency standard of the invention is also mounted to the frame element 101 of the device and is generally represented by circuit boards 107 and 108 of FIGS. 3 and 4. A better understanding of this circuitry and its functional relationships to the optical physics package of the invention can be had by reference to FIG. 5. Therein, the optical physics package is generally defined by the combination of the VCSEL, Optics Package, Cell, Fluorescence Detector and Transmission Detector. The RF Modulation Synthesizer generates the laser modulation signal related to the hyperfine frequency of the alkali atoms contained within the Cell. The circuit defined by the combination of the Fluorescence Detector, Transmission Detector, Digital Servo (which is preferably in the nature of a microcontroller), Wavelength Control line and the Laser Drive Current Source defines an atomic servo control loop whereby the current supplied to the laser source of the VCSEL is controlled by one or both of the transmitted or fluorescent light output of the Cell. In addition, the Digital Servo provides a frequency lock of the voltage controlled crystal oscillator (VCXO) to the hyperfine resonance which, in turn, provides the user output signal of the atomic frequency standard.

Figure 5:
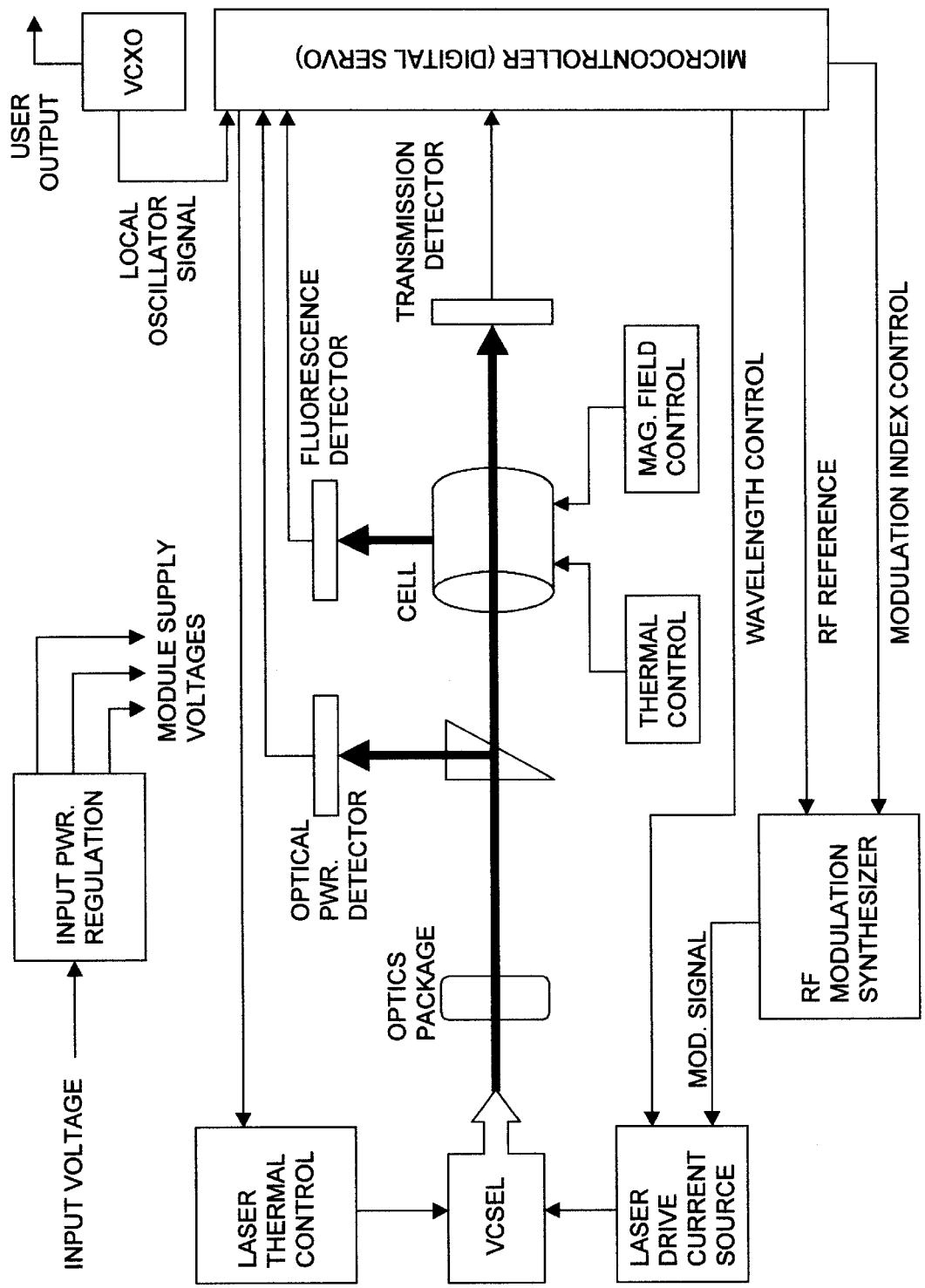
FIG. 5 is a block diagram showing operative functional associations between the elements of the optical physics package of the atomic frequency standard of FIGS. 3 and 4 and the electronic control and detection package thereof.

As will also be noted from FIG. 5, there is shown therein a preferred embodiment, not shown in FIGS. 3 and 4, wherein an Optical Power Detector polls the laser light beam fed to the Cell and provides this information to the Digital Servo. This Optical Power Detector function can be valuable in providing substantial common mode noise rejection benefits in the system.

Utilizing the principles of the present invention there is thus enabled the fabrication of atomic frequency standards of greatly reduced size and weight from those presently known. For example, the embodiment of the invention shown in FIGS. 3 and 4 hereof can fabricated with exterior dimensions of as little as, say, 1.5×1.5×2.5 inches, which yields a frequency standard structure occupying an overall volume of less than 100 cubic centimeters.

This disclosure reveals various preferred embodiments of the invention. However, many obvious variations in the form, construction and arrangement of components and the modified application of the invention are possible without departing from the essential scope or spirit of the invention as claimed. Accordingly, it should be recognized and understood that the scope of the present invention is to be limited only by the claims hereof and not to the specific preferred embodiments of the invention described hereinabove.

What is claimed is:

1. In an atomic frequency standard based on Coherent Population Trapping of an atomic ensemble comprising an admixture of alkali metal atoms and at least one inert buffer gas, said frequency standard comprising:

(A) an optical physics package including the following elements: (i) at least one solid state laser source for providing coherent radiation; (ii) optical modifier elements comprising a linear polarizer and a circular polarizer to least one laser source: (iii) a sealed resonance cell containing said admixture of alkali metal atoms and inert buffer gas therein, said resonance cell being optically transparent to receive therein light emanating from said at least one laser source and to transmit therefrom at least one of transmitted light and fluorescent light, and (iv) transmitted and fluorescent light from said resonance cell and (B) an electronic control and detection package, the improvement which comprises the combination of:
a frame element to receive and support the elements of said optical physics and electronic control and detection packages, said optical physics package having no microwave cavity, said optical modifier elements being integrated with said at least one solid state laser source and said sealed resonance cell being of metallic construction with optical windows to receive and transmit light therethrough.

2. The atomic frequency standard of claim 1 wherein each said solid state laser source is a vertical cavity surface emitting laser.

3. The atomic frequency standard of claim 1 comprising a single laser source.

4. The atomic frequency standard of claim 1 comprising multiple laser sources, only one of which being operative at any point in time.

5. The atomic frequency standard of claim 1 wherein said optical modifier elements include a collimator.

6. The atomic frequency standard of claim 1 wherein said optical modifier elements include a beam expander.

7. The atomic frequency standard of claim 1 wherein said resonance cell comprises a metallic chamber composed of a stiff non-magnetic metal, said chamber body having at least one inlet window aperture, at least one outlet window aperture and optically transparent window elements sealed to each said inlet and outlet window apertures.

8. The atomic frequency standard of claim 7 wherein said stiff non-magnetic metal is selected from the group consisting of: 404 Monel metal, beryllium, titanium, tantalum, tungsten, stainless steel, copper, molybdenum and alloys thereof.

9. The atomic frequency standard of claim 7 wherein said metallic chamber further comprises an integral cold weldable metallic pinch-off tubulation communicating with the interior thereof.

10. The atomic frequency standard of claim 7 wherein said resonance cell comprises one inlet window aperture, a first outlet window aperture coaxial with respect to said inlet window aperture and to transmit light transmitted through said cell therethrough and a second outlet window aperture normal to said first window aperture to transmit fluorescent light generated within said cell therethrough and wherein photodetector means are provided for each said outlet window aperture to receive and detect transmitted and fluorescent light.

11. The atomic frequency standard of claim 1 wherein said frame element comprises means to urge and maintain the elements of said optical physics package in optical alignment.

12. The atomic frequency standard of claim 11 wherein said optical alignment means comprises keyways cooperative with said elements of said optical physics package.

13. The frequency standard of claim 1 including means to control and maintain the temperature of said at least one laser source.

14. The frequency standard of claim 1 including magnetic shielding surrounding said resonance cell.

15. The frequency standard of claim 1 including means to control and maintain temperature within said resonance cell.

16. The frequency standard of claim 1 wherein said electronic control and detection package includes an atomic servo control loop to control each of said at least one laser source.

17. The frequency standard of claim 1 wherein said resonance cell is optically transparent to transmitted and fluorescent light therefrom and wherein photodetector means are provided to receive and detect said transmitted and fluorescent light from said cell.

* * * * *